United States Patent [19]
Sheridan-Eng

[11] Patent Number: 6,026,105
[45] Date of Patent: Feb. 15, 2000

[54] TECHNIQUE FOR MEASURING SEMICONDUCTOR LASER CHIRP

[75] Inventor: Julie Sheridan-Eng, Upper Macungie Township, Lehigh County, Pa.

[73] Assignee: Lucent Technologies, Inc., Murray Hill, N.J.

[21] Appl. No.: 09/030,539

[22] Filed: Feb. 23, 1998

[51] Int. Cl.[7] ............................ H01S 3/18; G02B 6/02; H04B 10/00
[52] U.S. Cl. ............................ 372/43; 372/26; 372/28; 385/123; 359/159; 359/160; 359/161
[58] Field of Search .................. 372/26, 20, 28, 372/29, 32, 43, 44, 50, 21; 385/123, 27, 28; 359/159, 160, 161

[56] References Cited

U.S. PATENT DOCUMENTS

| 5,078,464 | 1/1992 | Islam | 385/123 X |
|---|---|---|---|
| 5,144,374 | 9/1992 | Grego | 385/123 X |
| 5,430,569 | 7/1995 | Blauvelt et al. | 359/162 |
| 5,524,076 | 6/1996 | Rolland et al. | 385/8 |
| 5,550,667 | 8/1996 | Krimmel et al. | 359/180 |
| 5,652,763 | 7/1997 | Delfyett, Jr. | 372/107 |
| 5,850,303 | 12/1998 | Yamamoto et al. | 359/133 |
| 5,852,700 | 12/1998 | Caponi et al. | 385/123 |

*Primary Examiner*—Brian Healy

[57] ABSTRACT

A technique for characterizing laser chirp utilizes an optical fiber and its inherent interferometric properties. An RF modulating signal is applied to the laser, where the modulated output signal thereafter propagates through a conventional optical fiber. A photoreceiver and spectrum analyzer are coupled to the opposite end of the optical fiber. By adjusting the power of the applied RF signal, the maximum IIN can be determined. The laser chirp can then be calculated by dividing the measurement frequency by the modulation current associated with the maximum IIN value.

4 Claims, 2 Drawing Sheets

TECHNIQUE FOR MEASURING SEMICONDUCTOR LASER CHIRP

FIELD OF THE INVENTION

The present invention relates to a technique for measuring semiconductor laser chirp and, more particularly, to a technique that utilizes the inherent interferometric properties of an optical fiber to measure laser chirp.

BACKGROUND OF THE INVENTION

Frequency chirp of semiconductor lasers is a critical parameter for both analog and digital communications system performance. Prior art techniques for measuring chirp utilize a self-heterodyne method where a gated RF current is used to modulate a semiconductor laser. An interferometer is used to convert the frequency modulated optical output into an amplitude-modulated signal, which is then measured with a photoreceiver and spectrum analyzer to ascertain the degree of chirp present in the laser. In particular, by gating the RF current with a period τ equal to twice the delay associated with the interferometer, the modulated and unmodulated signals will mix together to generate a frequency chirp signal that can be observed by the spectrum analyzer.

Although this technique is well-accepted by the industry and provides accurate results, a separate test set including an interferometer is required to perform the analysis. The need for the test set thus adds to the production cost (and time) of the laser.

SUMMARY OF THE INVENTION

The present invention relates to a technique for measuring semiconductor laser chirp and, more particularly, to a technique that utilizes the inherent interferometric properties of an optical fiber to measure laser chirp. The inventive technique eliminates the need for a test set and interferometer, allowing measurement of chirp during routine system performance tests.

In accordance with the present invention, a modulating RF current is applied to a biased semiconductor laser and the output is thereafter passed through a conventional optical fiber. The interferometer intensity noise (IIN) is measured using a spectrum analyzer and the RF modulation power is adjusted until a peak noise signal is found, where this maximum total noise signal will correspond to the maximum IIN. The chirp of the laser may then be calculated by dividing the (known) measurement frequency by the modulation current associated with this maximum IIN value.

DETAILED DESCRIPTION

It has previously been shown that conventional optical fiber has inherent interferometric properties as a result of small inhomogeneities within the fiber. Therefore, mixing light that propagates directly through a fiber with light that has been twice Rayleigh backscattered (by these inhomogeneities) will generate interferometric intensity noise, or IIN. The IIN depends on system parameters, as well as on the dynamic linewidth ($\Delta v$) of the laser.

The linewidth of a conventional semiconductor laser can be expressed as follows:

$$g(v) = \frac{\left(\frac{\Delta v}{2\pi}\right)}{(v - v_0) + \left(\frac{\Delta v}{2\pi}\right)}, \quad (1)$$

I have studied the IIN through measurements and subsequent computer-based "fits" of the data. As a result of this work, I have determined that the IIN is a Lorenztian response and the chirp can be predicted from the IIN. In particular, the IIN spectrum is the convolution of equation (1) with itself, in Lorenztian form and centered at dc. In particular, the IIN spectrum can be expressed as follows:

$$g(v) = \frac{\left(\frac{2\Delta v}{2\pi}\right)}{(v) + \left(\frac{2\Delta v}{2\pi}\right)}. \quad (2)$$

Figure 1:
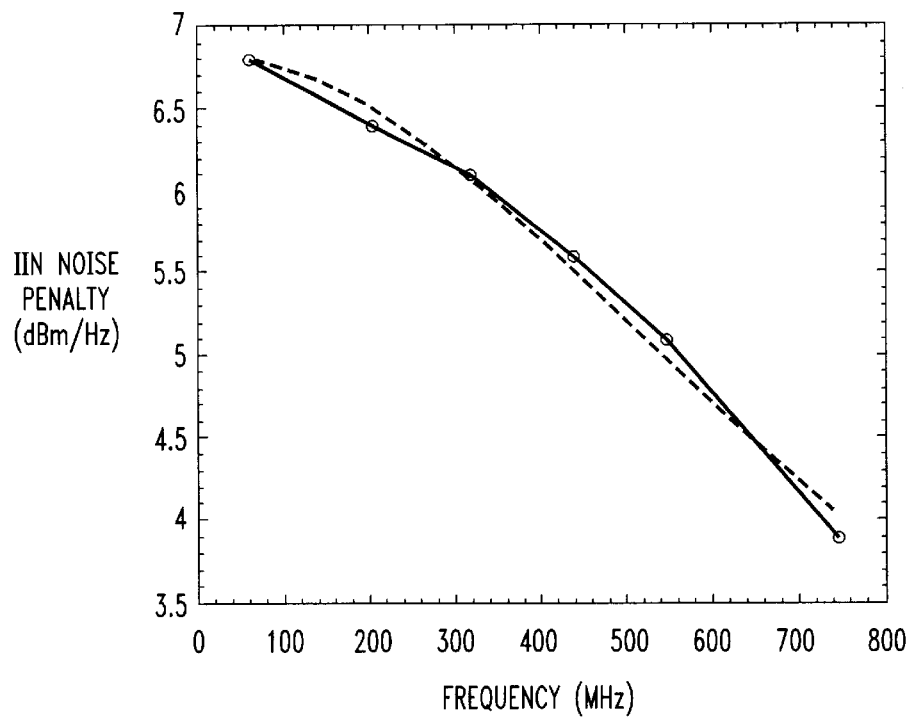
FIG. 1 is a graph illustrating IIN as a function of frequency.

Thus, the IIN response will follow the form illustrated in FIG. 1. At a particular frequency $v$, the maximum linewidth $\Delta v$ for a given $g(v)$ can be determined by taking the derivative of $g(v)$ with respect to $\Delta v$:

$$\frac{\partial g(v)}{\partial \Delta v} = \frac{1}{\pi}\left(\frac{1}{v^2 + \Delta v^2}\right) + \left(\frac{\Delta v}{\pi}\right)(-1)\left(\frac{1}{v^2 + \Delta v^2}\right)^2 2\Delta v$$

$$= \frac{1}{\pi}\left(\frac{1}{v^2 + \Delta v^2}\right) - \frac{2\Delta v^2}{\pi}\left(\frac{1}{v + \Delta v^2}\right)^2$$

$$= \frac{v^2 + \Delta v^2}{\pi(v^2 + \Delta v^2)^2} - \frac{2\Delta v^2}{\pi(v^2 + \Delta v^2)^2}.$$

To maximize this derivative, evaluate the response at 0, yielding:

$$v^2 + \Delta v^2 - 2\Delta v^2 = 0,$$

$$v^2 - \Delta v^2 = 0,$$

$$v^2 = \Delta v^2, \text{ or}$$

$$v = \pm \Delta v.$$

Therefore, when the IIN response is maximized at a particular frequency, that frequency will be exactly equal to the dynamic linewidth of the laser. The laser chirp can then be determined by dividing this measurement frequency by the modulating current $i_{op}$:

$$\text{chirp} = \frac{f_{meas}}{i_{op}}$$

Figure 2:
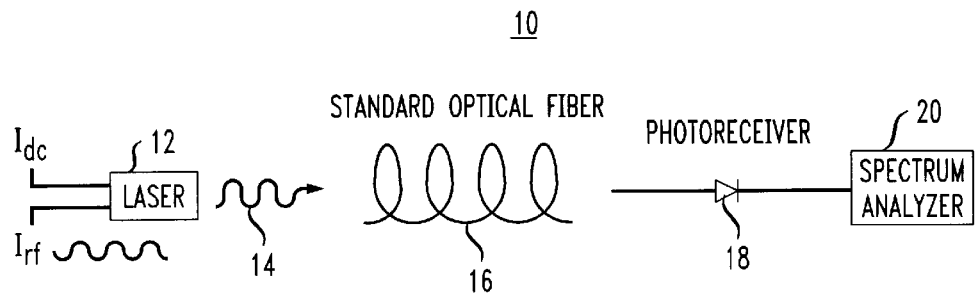
FIG. 2 illustrates an exemplary testing arrangement using the method of the present invention.

FIG. 2 illustrates an exemplary environment 10 where the chirp measurement system of the present invention may be used. A semiconductor laser 12 is biased with a dc current $I_{dc}$ and an RF modulating current $I_{rf}$. The optical output 14 from laser 12 is thereafter coupled into an optical fiber 16.

The optical signal 14 propagates through fiber 14 (and is subject to Rayleigh backscattering as mentioned above) and thereafter impinges a conventional photoreceiver 18. Photoreceiver 18 functions to convert the received optical signal into an electrical representation. The electrical output signal from photoreceiver 18 is then coupled into a spectrum analyzer 20. Spectrum analyzer 20 is used to measure the intensity noise present in the electrical signal. In particular, the measured noise is a combination of various factors that contribute to noise: shot noise, IIN, laser relative intensity noise, and receiver noise.

Figure 3:
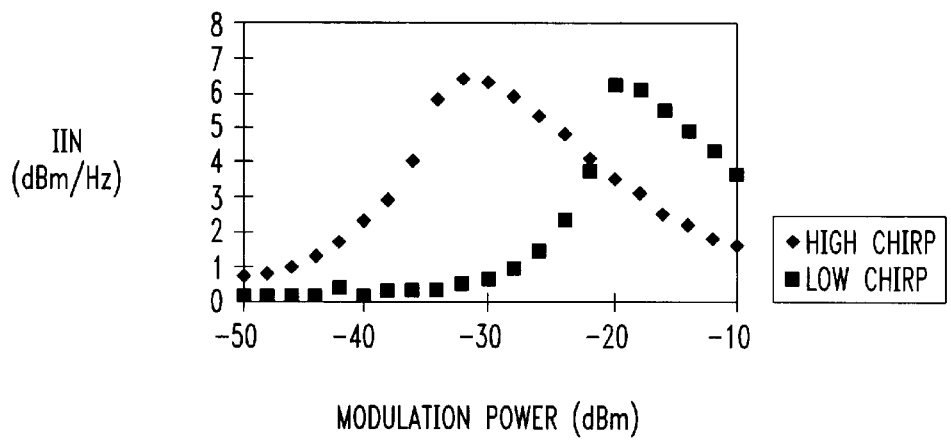
FIG. 3 is a graph illustrating IIN as a function of modulation power.

As the power of the RF modulation signal is increased, the IIN will first increase, then decrease, as illustrated in FIG. 3. In particular, FIG. 3 is a graph of IIN as a function of modulation signal power for two exemplary semiconductor lasers. Since IIN is the only noise factor that is a function of RF modulation power, the power at which the maximum noise level is achieved will, by definition, be the power where IIN is at its maximum. At that modulation power, as shown above, the dynamic linewidth $\Delta v$ of the laser will be exactly equal to the (known) measurement frequency, denoted $f_{meas}$. As discussed above, the chirp of the laser can then calculated by dividing $f_{meas}$ by the zero-to-peak value of the modulation current. The current can be calculated from either the electrical modulation power, or the optical modulation index, both being well-known techniques.

Figure 4:
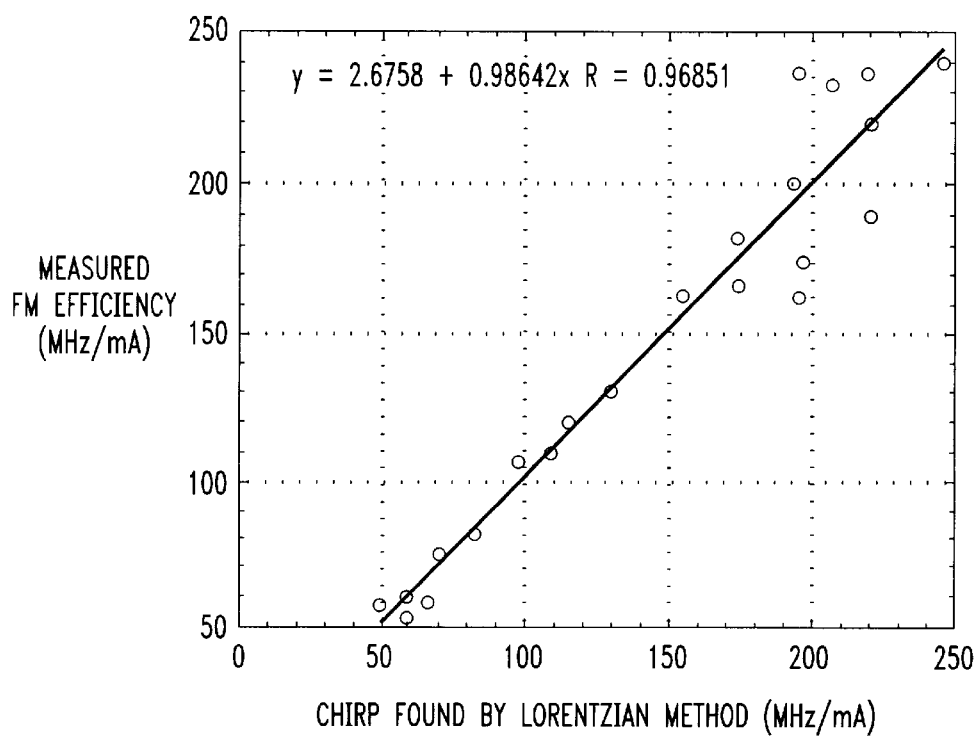
FIG. 4 is a graph showing the correlation between a conventional chirp measurement technique and the fiber interferometric technique of the present invention.

FIG. 4 is a graph illustrating the correlation between the chirp measurement using the inventive technique and the prior art interferometer system. As shown, the correlation is extremely close.

It is to be understood that the technique as described above is applicable to virtually any semiconductor laser and may utilize any type of conventional optical fiber. Advantageously, it is now possible to characterize laser chirp of a packaged laser, or of a laser chip is a standard system. That is, a specialized test set including an interferometer is no longer required.

What is claimed is:

1. A method of determining frequency chirp of a semiconductor laser at a predetermined bias current, the method comprising the steps of:

a) providing a semiconductor laser biased at said predetermined bias current $I_{dc}$, said predetermined bias current sufficient to provide lasing;

b) applying an RF current $I_{rf}$ to said semiconductor laser at a predetermined frequency to generate an RF modulated optical output signal;

c) propagating the RF modulated optical output signal through an optical fiber;

d) coupling a photoreceiver to said optical fiber and converting the received RF modulated optical output signal into an electrical representation thereof;

e) measuring the converted electrical signal to determine the noise signal power;

f) adjusting the power of the applied RF current until a maximum noise signal is measured in step e);

g) dividing the predetermined frequency of step b) by the adjusted modulating current of step f) to define the laser chirp.

2. The method as defined in claim 1 wherein in performing step f), the power of the applied RF current is first increased, then decreased to ascertain the maximum noise signal level.

3. The method as defined in claim 1 wherein in performing step e), the noise signal is measured by performing a spectrum analysis.

4. Arrangement for determining the chirp of a semiconductor laser biased at a predetermined DC current and responsive to an applied RF modulation signal operating at a predetermined frequency, the arrangement comprising an optical fiber coupled to the output of the semiconductor laser for allowing the RF modulated optical signal to propagate therethrough, said optical signal creating interferometric intensity noise as it propagates through said fiber;

a photoreceiver and spectrum analyzer coupled in series to said optical fiber for measuring the noise signal present in the RF modulated optical signal; and means for adjusting the power of the applied RF modulation signal to determine the maximum IIN noise, wherein the laser chirp is defined as the predetermined frequency divided by the RF current associated with the maximum IIN value.

* * * * *